(12) United States Patent
Yamamoto

(10) Patent No.: US 7,620,382 B2
(45) Date of Patent: Nov. 17, 2009

(54) FREQUENCY CONVERTER CAPABLE OF PREVENTING LEVEL OF INTERMEDIATE FREQUENCY SIGNAL FROM LOWERING DUE TO RISE IN TEMPERATURE

(75) Inventor: Masaki Yamamoto, Fukushima-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 816 days.

(21) Appl. No.: 11/415,606

(22) Filed: May 1, 2006

(65) Prior Publication Data

US 2006/0281430 A1 Dec. 14, 2006

(30) Foreign Application Priority Data

Jun. 9, 2005 (JP) .............................. 2005-169799

(51) Int. Cl.
*H04B 1/16* (2006.01)
(52) U.S. Cl. ..................... 455/343.1; 455/323; 455/333; 455/234.1; 455/571; 455/258; 455/313
(58) Field of Classification Search ... 455/232.1–343.6, 455/75, 571–574, 522
See application file for complete search history.

(56) References Cited

U.S. PATENT DOCUMENTS

| | | | | |
|---|---|---|---|---|
| 3,575,662 A | * | 4/1971 | Davisson | 455/168.1 |
| 3,579,115 A | * | 5/1971 | Goncharoff et al. | 455/195.1 |
| 4,011,514 A | * | 3/1977 | Wroblewski | 455/169.2 |
| 4,061,981 A | * | 12/1977 | Endres et al. | 455/192.2 |
| 4,145,659 A | * | 3/1979 | Wolfram | 455/179.1 |
| 4,194,158 A | * | 3/1980 | Tanabe et al. | 455/333 |
| 4,355,414 A | * | 10/1982 | Inoue | 455/184.1 |
| 4,371,980 A | * | 2/1983 | Erickson | 455/208 |
| 4,556,990 A | * | 12/1985 | Hasler | 455/333 |
| 4,580,285 A | * | 4/1986 | Richards, Jr. | 455/161.3 |
| 4,780,909 A | * | 10/1988 | Sakashita et al. | 455/161.3 |
| 4,928,314 A | * | 5/1990 | Grandfield et al. | 455/236.1 |
| 5,001,776 A | * | 3/1991 | Clark | 455/226.2 |
| 5,517,684 A | * | 5/1996 | Fujita et al. | 455/234.2 |
| 5,634,207 A | * | 5/1997 | Yamaji et al. | 455/323 |
| 5,815,821 A | * | 9/1998 | Pettersson | 455/574 |
| 5,881,364 A | * | 3/1999 | Higuchi | 340/7.2 |
| 5,929,716 A | * | 7/1999 | Komori et al. | 331/135 |
| 5,930,696 A | * | 7/1999 | Tzuang et al. | 455/311 |
| 6,026,286 A | * | 2/2000 | Long | 455/327 |
| 6,122,497 A | * | 9/2000 | Gilbert | 455/333 |
| 6,654,595 B1 | * | 11/2003 | Dexter | 455/323 |
| 6,711,396 B1 | * | 3/2004 | Bergsma et al. | 455/317 |

(Continued)

FOREIGN PATENT DOCUMENTS

JP 10-335942 12/1998

(Continued)

*Primary Examiner*—Lana N Le
*Assistant Examiner*—RuiMeng Hu
(74) *Attorney, Agent, or Firm*—Beyer Law Group LLP

(57) ABSTRACT

There is provided a bias power supply for setting a collector bias current of a mixer transistor and a collector bias current of an oscillation transistor. When a control voltage is equal to or smaller than a first predetermined value, an output voltage of the bias power supply is set to be increased so that at least one of the collector bias current of the mixer transistor and the collector bias current of the oscillation transistor can be increased.

8 Claims, 5 Drawing Sheets

U.S. PATENT DOCUMENTS

| | | | |
|---|---|---|---|
| 6,775,525 B1 * | 8/2004 | Tanoue et al. | 455/127.3 |
| 6,795,128 B2 * | 9/2004 | Yamamoto | 348/729 |
| 6,950,152 B2 * | 9/2005 | Yamamoto | 348/731 |
| 7,010,330 B1 * | 3/2006 | Tsividis | 455/574 |
| 7,019,790 B2 * | 3/2006 | Yamamoto | 348/725 |
| 7,298,426 B2 * | 11/2007 | Yamamoto | 348/731 |
| 7,363,015 B2 * | 4/2008 | Yamamoto | 455/260 |
| 2004/0063410 A1 * | 4/2004 | Pugel | 455/191.1 |
| 2004/0063415 A1 * | 4/2004 | Python et al. | 455/307 |
| 2004/0116091 A1 * | 6/2004 | McGinn | 455/193.1 |
| 2004/0171360 A1 * | 9/2004 | Oosawa et al. | 455/136 |
| 2005/0090218 A1 * | 4/2005 | Ishida et al. | 455/255 |
| 2005/0197085 A1 * | 9/2005 | Tsukizawa et al. | 455/264 |
| 2005/0266815 A1 * | 12/2005 | Miyagi | 455/234.1 |
| 2005/0270429 A1 * | 12/2005 | Yamamoto | 348/731 |
| 2006/0035619 A1 * | 2/2006 | Hallivuori et al. | 455/333 |
| 2006/0258313 A1 * | 11/2006 | Uozumi et al. | 455/252.1 |
| 2006/0293004 A1 * | 12/2006 | Irie et al. | 455/127.3 |

FOREIGN PATENT DOCUMENTS

| | | |
|---|---|---|
| JP | 2004-172934 | 6/2004 |
| JP | 2004-187101 | 7/2004 |

* cited by examiner

FREQUENCY CONVERTER CAPABLE OF PREVENTING LEVEL OF INTERMEDIATE FREQUENCY SIGNAL FROM LOWERING DUE TO RISE IN TEMPERATURE

BACKGROUND OF THE INVENTION

1. Field of the Invention

The present invention relates to a frequency converter used for a television tuner or the like.

2. Description of the Related Art

FIG. 7 shows a conventional oscillation circuit used for a VHF television tuner, for example, and the oscillation circuit includes a first oscillation transistor 2 and a second oscillation transistor 3 provided within an integrated circuit 20 and a resonating circuit 4 provided outside the integrated circuit 20. The first and second oscillation; transistors 2 and 3 are differentially connected to each other.

The resonating circuit 4 provided outside the integrated circuit 20 is coupled to a base of the first oscillation transistor 2 and a collector of the second oscillation transistor 3 through a terminal 20a. The resonating circuit 4 includes an inductive element 4a and a varactor diode 4b, and one end of the resonating circuit 4 is connected to the terminal 20a and the other end of the resonating circuit is grounded outside the integrated circuit 20. In addition, an oscillation frequency is set by a tuning voltage Tu applied to the varactor diode 4b. In the oscillation circuit, although not shown, a bias voltage supplied from a power supply is applied to bases of the oscillation transistors 2 and 3. A value of the bias voltage is normally constant (for example, refer to JP-A-2004-172934). An oscillation signal is output from the collector of the oscillation transistor 3.

Further, FIG. 8 shows a conventional mixer to which an oscillation signal is supplied. The mixer is also provided within an integrated circuit. A first transistor 31 and a second transistor 32 are differentially connected to each other. A television signal is input to an input terminal 34 connected to a base of the first transistor 31. A base of the second transistor 32 is grounded in a high-frequency manner. A constant bias voltage is applied to the bases of the first and second transistors 31 and 32.

A collector of the first transistor 31 is connected to an emitter of a third transistor 36 and an emitter of a fourth transistor 37. In addition, a collector of the second transistor 32 is connected to an emitter of a fifth transistor 38 and an emitter of a sixth transistor 39. Thus, the third transistor 36 and the fourth transistor 37 are differentially connected to each other, and the fifth transistor 38 and the sixth transistor 39 are differentially connected to each other.

A base of the third transistor 36 and a base of the sixth transistor 39 are connected to each other and are then connected to an input terminal 40 of a local oscillation signal, and a base of the fourth transistor 37 and a base of the fifth transistor 38 are connected to each other and are then connected to an input terminal 41 of a local oscillation signal. The local oscillation signal is balanced-input between the input terminals 40 and 41.

In addition, a collector of the third transistor 36 and a collector of the fifth transistor 38 are connected to each other, and a collector of the fourth transistor 37 and a collector of the sixth transistor 39 are connected to each other. At this time, connection points between the collector of the third transistor 36 and the collector of the fifth transistor 38 and between the collector of the fourth transistor 37 and the collector of the sixth transistor 39 become output terminals 42 and 43 from which intermediate frequency signals are balanced output, respectively. A power supply voltage is applied to each of the connection points through feed resistors 44 and 45 (for example, refer to JP-A-2004-187101).

However, in the oscillation circuit described above, if the capacitance value of the varactor diode 4b is increased by lowering a control voltage in order to reduce the oscillation frequency, a resistance component of the varactor diode is increased and a Q-factor of the resonating circuit 4 is decreased. As a result, the loop gain of the oscillation circuit becomes insufficient, which may reduce the oscillation power, and in an extreme case, the oscillation may stop. In addition, since the loop gain is decreased due to a rise in temperature, there is a possibility that the oscillation power will be reduced or the oscillation will stop. If the oscillation power is decreased, the conversion efficiency of the mixer is reduced, which lowers the level of an intermediate frequency signal that is output. In addition, the gain of the mixer is also decreased due to the rise in temperature.

SUMMARY OF THE INVENTION

The invention is designed to solve the above-mentioned problem, and it is an object of the invention to prevent oscillation from stopping when an oscillation frequency is lowered and to prevent the level of an intermediate frequency signal from lowering due to a rise in temperature.

In order to achieve the above object, according to an aspect of the invention, a frequency converter includes: a mixer that frequency-converts a received signal to an intermediate frequency signal and has a mixer transistor; an oscillation circuit that supplies an local oscillation signal to the mixer and has an oscillation transistor; a resonating circuit coupled to the oscillation transistor and having a varactor diode, a control voltage for controlling an oscillation frequency being applied to a cathode of the varactor diode; and a bias power supply for setting a collector bias current of the mixer transistor and a collector bias current of the oscillation transistor. The received signal and the local oscillation signal are input to the mixer transistor. When the control voltage is equal to or smaller than a first predetermined value, an output voltage of the bias power supply is set to be increased so that at least one of the collector bias current of the mixer transistor and the collector bias current of the oscillation transistor can be increased.

In the invention, preferably, the output voltage of the bias power supply has a positive temperature coefficient.

Further, in the invention, preferably, the bias power supply includes a power supply-side resistor whose one end is pulled up to a power supply and a ground-side resistor whose one end is grounded and the other end is connected to the other end of the power supply-side resistor, and the output voltage is output through a connection point between the power supply-side resistor and the ground-side resistor. In addition, preferably, a resistance temperature coefficient of the power supply-side resistor is set to be smaller than a resistance temperature coefficient of the ground-side resistor so that at least one of a resistance value of the power supply-side resistor and a resistance value of the ground-side resistor switches differently when the control voltage is equal to or larger than the first predetermined value and is equal to or smaller than the first predetermined value.

Furthermore, in the invention, preferably, the bias power supply includes a first bias power supply and a second bias power supply, and the collector bias current of the oscillation transistor is set by the first bias power supply and the collector bias current of the mixer transistor is set by the second bias power supply.

Moreover, in the invention, preferably, in the first bias power supply, the power supply-side resistor has a first resistor whose one end is pulled up to the power supply and a second resistor connected in parallel to the first resistor through a first switching transistor, and the ground-side resistor has a third resistor whose end is grounded and the other end is connected to the other end of the first resistor. In addition, preferably, the first switching transistor is turned off when the control voltage is equal to or larger than the first predetermined value and is turned on when the control voltage is equal to or smaller than the first predetermined value.

Further, in the invention, preferably, in the first bias power supply, the power supply-side resistor has a first resistor whose one end is pulled up to the power supply, and the ground-side resistor has a third resistor whose end is grounded and the other end is connected to the other end of the first resistor and a fourth resistor connected in parallel to the third resistor through a first switching transistor. In addition, preferably, the first switching transistor is turned on when the control voltage is equal to or larger than the first predetermined value and is turned off when the control voltage is equal to or smaller than the first predetermined value.

Furthermore, in the invention, preferably, a tuning circuit whose tuning frequency is changed by the control voltage is provided at a previous stage of the mixer. In addition, in the second bias power supply, the power supply-side resistor has a first resistor whose one end is pulled up to the power supply and a second resistor connected in parallel to the first resistor through a first switching transistor, and the ground-side resistor has a third resistor whose one end is grounded and the other end is connected to the other end of the first resistor and a fourth resistor connected in parallel to the third resistor through a second switching transistor. In addition, preferably, the first switching transistor is turned off when the control voltage is equal to or larger than the first predetermined value and is turned on when the control voltage is equal to or smaller than the first predetermined value, and the second switching transistor is turned on when the control voltage is within a range between a second predetermined value and a third predetermined value higher than the first predetermined value and is turned off when the control voltage is not within the range.

Furthermore, in the invention, preferably, the oscillation transistor, the mixer transistor, and the bias power supply are provided within an integrated circuit, a switching control circuit for switching between on/off of a switching transistor is provided within the integrated circuit, and frequency data for channel selection is input to the switching control circuit.

According to the invention, the frequency converter includes the mixer that frequency-converts the received signal to an intermediate frequency signal and has the mixer transistor; an oscillation circuit that supplies an local oscillation signal to the mixer and has an oscillation transistor; a resonating circuit coupled to the oscillation transistor and having the varactor diode, the control voltage for controlling an oscillation frequency being applied to the cathode of the varactor diode; and a bias power supply for setting the collector bias current of the mixer transistor and the collector bias current of the oscillation transistor. In addition, the received signal and the local oscillation signal are input to the mixer transistor, and when the control voltage is equal to or smaller than the first predetermined value, an output voltage of the bias power supply is set to be increased so that at least one of the collector bias current of the mixer transistor and the collector bias current of the oscillation transistor can be increased. Accordingly, even though a Q-factor decreases due to an increase of a resistance component of the varactor diode when the control voltage is low, a gain of the oscillation transistor or the mixer transistor increases. As a result, it is possible to prevent the oscillation from stopping and to raise the level of the intermediate frequency signal.

Further, according to the invention, since the output voltage of the bias power supply has a positive temperature coefficient, it is possible to prevent the loop gain of the oscillation circuit from decreasing or to prevent the conversion efficiency of the mixer from lowering by increasing the collector current of the oscillation transistor or the collector current of the mixer transistor at the time of the rise in temperature.

Furthermore, according to the invention, the bias power supply includes the power supply-side resistor whose one end is pulled up to the power supply and the ground-side resistor whose one end is grounded and the other end is connected to the other end of the power supply-side resistor, the output voltage is output through the connection point between the power supply-side resistor and the ground-side resistor, and the resistance temperature coefficient of the power supply-side resistor is set to be smaller than the resistance temperature coefficient of the ground-side resistor so that at least one of the resistance value of the power supply-side resistor and the resistance value of the ground-side resistor switches differently when the control voltage is equal to or larger than the first predetermined value and is equal to or smaller than the first predetermined value. Accordingly, the bias voltage can have a positive temperature coefficient.

Moreover, according to the invention, since the bias power supply includes the first bias power supply and the second bias power supply and the collector bias current of the oscillation transistor is set by the first bias power supply and the collector bias current of the mixer transistor is set by the second bias power supply, it is possible to set optimal collector bias currents.

In addition, according to the invention, in the first bias power supply, the power supply-side resistor has the first resistor whose one end is pulled up to the power supply and the second resistor connected in parallel to the first resistor through the first switching transistor, the ground-side resistor has the third resistor whose end is grounded and the other end is connected to the other end of the first resistor, and the first switching transistor is turned off when the control voltage is equal to or larger than the first predetermined value and is turned on when the control voltage is equal to or smaller than the first predetermined value. Accordingly, since the bias voltage can switch between two modes due to the first switching transistor, any bias voltage can have a positive temperature coefficient.

Further, according to the invention, in the first bias power supply, the power supply-side resistor has the first resistor whose one end is pulled up to the power supply, the ground-side resistor has the third resistor whose end is grounded and the other end is connected to the other end of the first resistor and the fourth resistor connected in parallel to the third resistor through the first switching transistor, and the first switching transistor is turned on when the control voltage is equal to or larger than the first predetermined value and is turned off when the control voltage is equal to or smaller than the first predetermined value. Accordingly, since the bias voltage can switch between two modes due to the first switching transistor, any bias voltage can have a positive temperature coefficient.

Furthermore, according to the invention, the tuning circuit whose tuning frequency is changed by the control voltage is provided at a previous stage of the mixer. In addition, in the second bias power supply, the power supply-side resistor has the first resistor whose one end is pulled up to the power supply and the second resistor connected in parallel to the first resistor through the first switching transistor, and the ground-side resistor has the third resistor whose one end is grounded and the other end is connected to the other end of the first resistor and the fourth resistor connected in parallel to the third resistor through a second switching transistor. In addition, the first switching transistor is turned off when the control voltage is equal to or larger than the first predetermined value and is turned on when the control voltage is equal to or smaller than the first predetermined value, and the second switching transistor is turned on when the control voltage is within a range between the second predetermined value and the third predetermined value higher than the first predetermined value and is turned off when the control voltage is not within the range. Accordingly, it is possible to compensate the gain deviation due to the frequency characteristic of the insertion loss of the tuning circuit located at the previous stage of the mixer.

In addition, according to the invention, the oscillation transistor, the mixer transistor, and the bias power supply are provided within the integrated circuit, the switching control circuit for switching between on/off of the switching transistor is provided within the integrated circuit, and frequency data for channel selection is input to the switching control circuit. Accordingly, since the bias voltage can easily switch between the two modes due to the frequency data, any bias voltage can have a positive temperature coefficient.

DESCRIPTION OF THE PREFERRED EMBODIMENT

Figure 1:
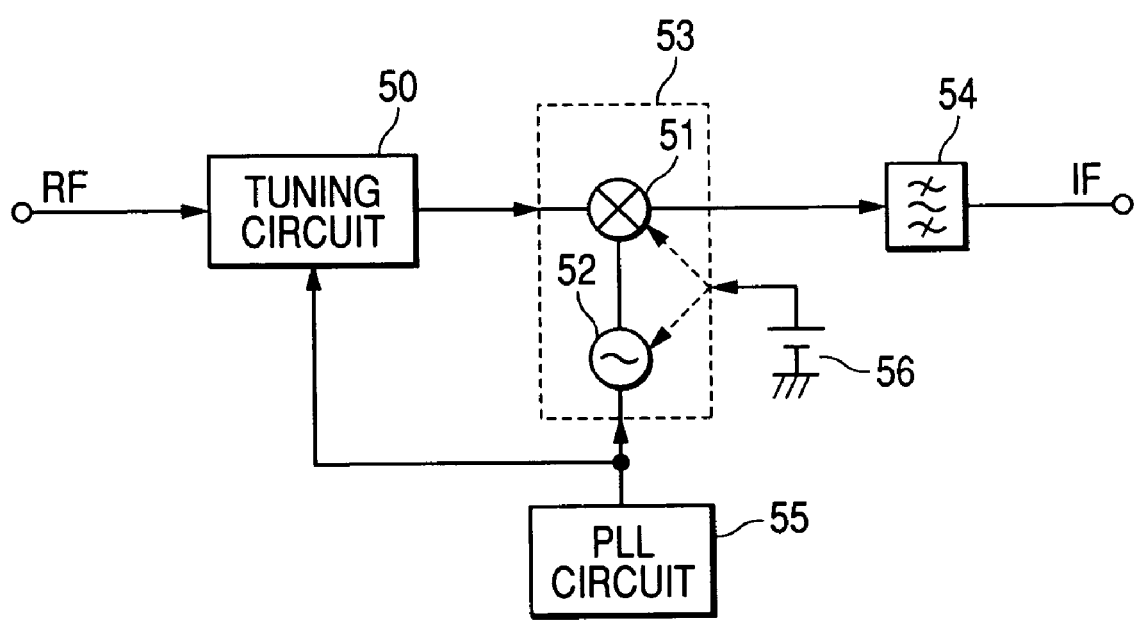
FIG. 1 is a view showing a basic configuration of a television tuner to which a frequency converter of the invention is applied.

FIG. 1 shows a basic configuration of a television tuner to which a frequency converter of the invention is applied. A television signal (RF) is input to a mixer 51 through a tuning circuit 50 having a varactor diode (not shown). A local oscillation signal is supplied to the mixer 51 from an oscillation circuit 52. The oscillation circuit 52 also has a varactor diode (not shown). The mixer 51 and the oscillation circuit 52 form the frequency converter 53. An intermediate frequency signal (IF) output from the mixer 51 is supplied to a subsequent-stage circuit through an intermediate frequency tuning circuit 54. A tuning frequency of the tuning circuit 50 and an oscillation frequency of the oscillation circuit 52 are controlled by a PLL circuit 55. That is, a control voltage Vt output from the PLL circuit 55 is applied to the varactor diode of the tuning circuit 50 and the varactor diode of the oscillation circuit 52. If the control voltage Vt increases, the tuning frequency and the oscillation frequency also increase, and if the control voltage Vt decreases, the tuning frequency and the oscillation frequency decreases. In addition, each of the mixer 51 and the oscillation circuit 52 includes a transistor, and a bias voltage supplied from a bias power supply 56 is applied to the transistor.

Figure 2:
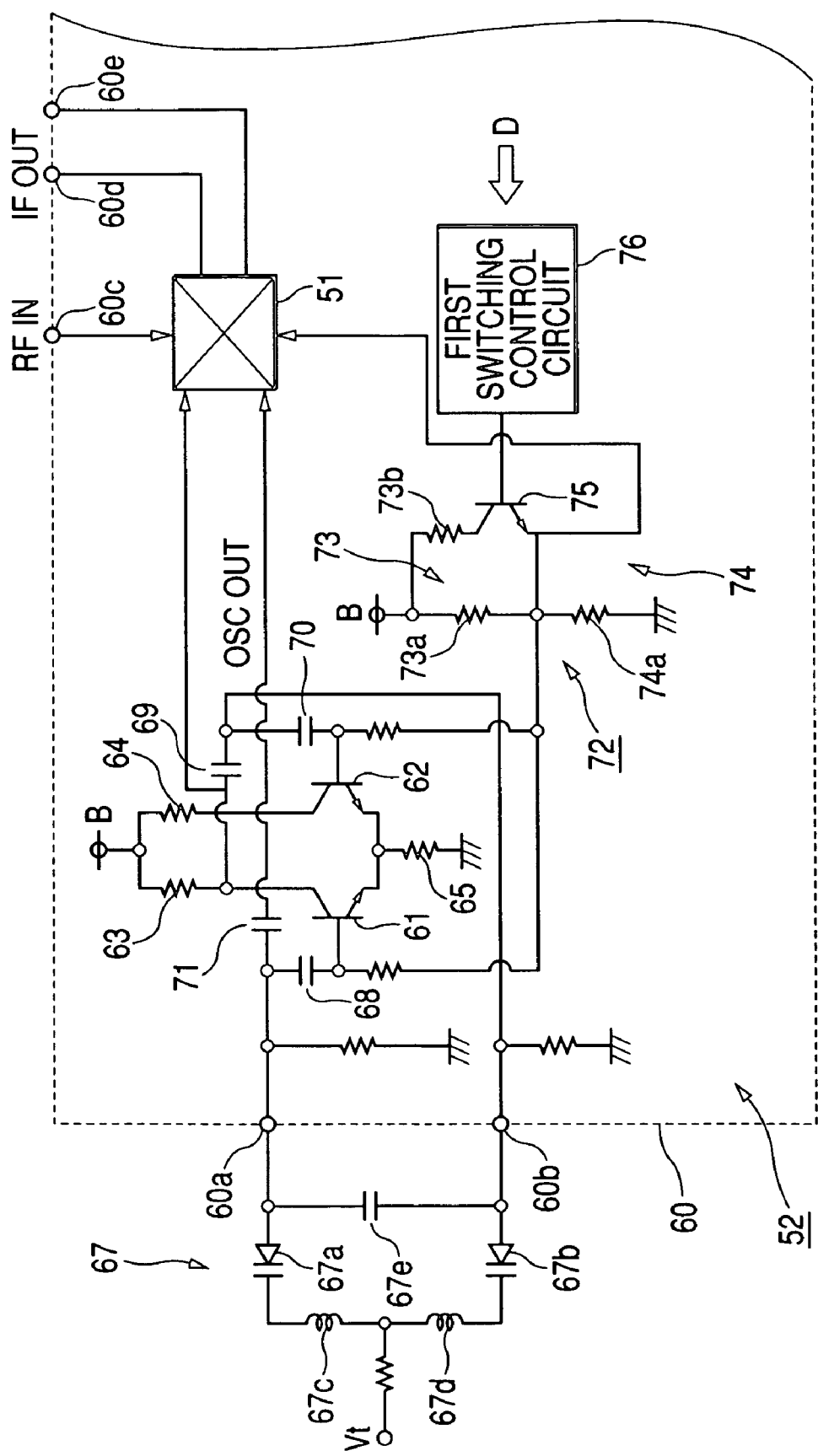
FIG. 2 is a view showing an oscillation circuit used for the frequency converter of the invention.

FIG. 2 shows a detailed configuration of the oscillation circuit 52, the mixer 51, and the bias power supply 56 in the frequency converter 53. A first oscillation transistor 61 and a second oscillation transistor 62 provided within an integrated circuit 60 are differentially connected to each other, and collectors of the first oscillation transistor 61 and the second oscillation transistor 62 are pulled up to a power supply B through resistors 63 and 64, respectively. In addition, due to the differential connection, emitters of the first oscillation transistor 61 and the second oscillation transistor 62 are grounded through a resistor 65 which is common thereto. A bias voltage supplied from a first bias power supply 72 is applied to bases of the first oscillation transistor 61 and the second oscillation transistor 62, and thus a collector bias current is set. In addition, a resonating circuit 67 provided outside the integrated circuit 60 is coupled to the first oscillation transistor 61 and the second oscillation transistor 62.

The resonating circuit 67 includes two varactor diodes 67a and 67b, two inductive elements 67c and 67d connected in series to each other between cathodes of the two varactor diodes 67a and 67b, and a capacitive element 67e connected between anodes of the two varactor diodes 67a and 67b. A control voltage Vt supplied from the PLL circuit 55 is applied to a connection point between the two inductive elements 67c and 67d. The anodes of the two varactor diodes 67a and 67b are coupled between the collector and the base of the first oscillation transistor 61 and between the collector and the base of the second oscillation transistor 62 through external connection terminals 60a and 60b of the integrated circuit 60, respectively. In addition, the anodes of the varactor diodes 67a and 67b are grounded in a direct-current manner.

That is, the anode of the varactor diode 67a is coupled to the base of the first oscillation transistor 61 through a coupling capacitor 68, and the anode of the varactor diode 67b is coupled to the collector of the first oscillation transistor 61 through a coupling capacitor 69. Similarly, the anode of the varactor diode 67b is coupled to the base of the second oscillation transistor 62 through a coupling capacitor 70, the anode of the varactor diode 67a is coupled to the collector of the second oscillation transistor 62 through a coupling capacitor 71.

In general, the temperature affects the loop gain of an oscillation circuit, and the loop gain decreases if the temperature rises. Further, in general, if the control voltage Vt is reduced (oscillation frequency is lowered) in order to increase the capacitance value, a resistance component of a varactor diode increases. As a result, the Q-factor of the resonating circuit 67 is decreased.

Therefore, in the invention, in order to solve those problems described above, the first bias power supply 72 provided within the integrated circuit 60 has a temperature characteristic, and a bias voltage value is switched so as to apply the bias voltage to the first oscillation transistor 61 and the second oscillation transistor 62. The first bias power supply 72 will be now described below.

First, the first bias power supply 72 includes a power supply-side resistor 73 whose one end is pulled up to the power supply B; and a ground-side resistor 74 whose one end is grounded and the other end is connected to the other end of the power supply-side resistor 73. Through a connection point between the power supply-side resistor 73 and the ground-side resistor 74, a bias voltage is applied to the bases of the first and second oscillation transistors 61 and 62.

The power supply-side resistor 73 has a first resistor 73a whose one end is pulled up to the power supply B; and a second resistor 73b connected in parallel to the first resistor 73a through a first switching transistor 75. In addition, the ground-side resistor 74 has a third resistor 74a whose end is grounded and the other end is connected to the other end of the first resistor 73a. Even though the first switching transistor 75 is an NPN-type transistor, the first switching transistor 75 may be a PNP-type transistor. A resistance value of each of the first resistor 73a and the second resistor 73b has a positive temperature coefficient (about +700 PPM/° C.) increasing as the temperature rises. In addition, a resistance value of the third resistor 74a has a positive temperature coefficient (about +1200 PPM/° C.) increasing as the temperature rises. That is, a resistance temperature coefficient of the power supply-side resistor 73 is smaller than a resistance temperature coefficient of the ground-side resistor 74.

Furthermore, a switching voltage output from a first switching control circuit 76 is applied to a base of the first switching transistor 75. The first switching control circuit 76 is input with frequency data D corresponding to a receiving channel. The frequency data D is composed of, for example, data having several tens of bits. Here, if the frequency of a receiving channel is increased, significant bit data is sequentially changed from 0 to 1. Accordingly, it is possible to determine whether the frequency of the receiving channel is high or low on the basis of only the most significant bit data.

For example, when the most significant bit data is 0 (accordingly, when the control voltage Vt is equal to or smaller than a first predetermined value), the first switching control circuit 76 turns on the first switching transistor 75. As a result, the resistance value of the power supply-side resistor 73 becomes small and thus the bias voltage increases. In addition, when the most significant bit data is 1 (accordingly, when the control voltage Vt is equal to or larger than the first predetermined value), the first switching control circuit 76 turns off the first switching transistor 75. As a result, the bias voltage decreases.

Figure 3:
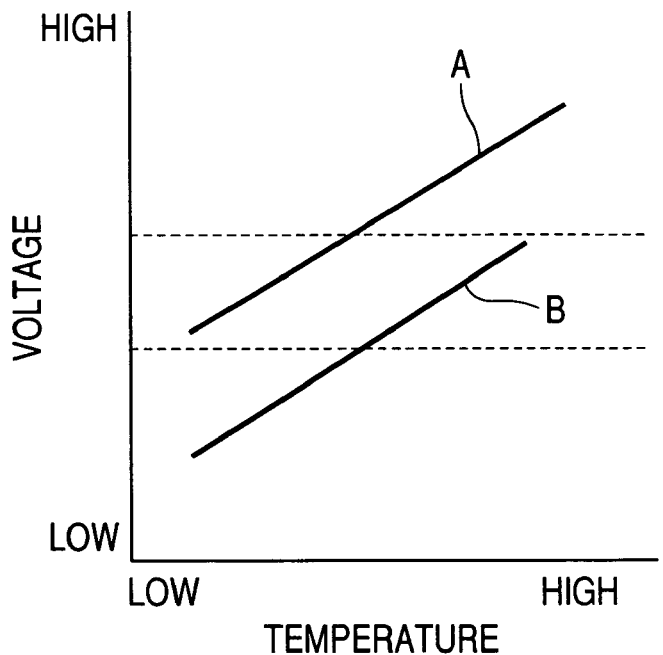
FIG. 3 is a view showing a characteristic of a bias power supply used for the frequency converter of the invention.

As such, the bias voltage output from the first bias power supply 72 increases as shown by a line A of FIG. 3 when the control voltage Vt is equal to or smaller than the first predetermined value, and the bias voltage output from the first bias power supply 72 decreases as shown by a line B of FIG. 3 when the control voltage Vt is equal to or larger than the first predetermined value. In addition, in any of the above cases, due to the resistance temperature coefficient, the bias voltage has a positive temperature coefficient in which the voltage value increases according to the rise in temperature.

Moreover, when the Q-factor of the resonating circuit 67 decreases under a state in which the control voltage Vt is equal to or smaller than the first predetermined value, the bias voltage increases, and accordingly, a collector bias current of each of the first and second oscillation transistors 61 and 62 increases. As a result, the loop gain increases, thereby preventing the oscillation power from being reduced or the oscillation from stopping, for example. In addition, when the control voltage Vt is equal to or larger than the first predetermined value, the bias voltage is reduced so as to decrease the collector bias current of each of the first and second oscillation transistors 61 and 62. As a result, the loop gain of the oscillation circuit 52 is suppressed as small as possible, and thus the oscillation power and unnecessary radiation can be prevented.

Further, even though the loop gain is willing to decrease, the collector bias current increases, and accordingly, it is possible to suppress the decrease of the loop gain. In contrast, even though the loop gain increases excessively due to a fall in temperature and thus abnormal oscillation is willing to occur, the collector bias current decreases, and accordingly, it is possible to suppress the increase of the loop gain.

The oscillation signal is output from the collectors of the first and second oscillation transistors 61 and 62 so as to be supplied to the mixer 51. In addition, the bias voltage output from the first bias power supply 72 is applied to the mixer 51. In addition, a television signal (RF) is input to the mixer 51 through an external connection terminal 60c, and an intermediate frequency signal (IF) is output to the outside of the integrated circuit 60 through external connection terminals 60d and 60e.

Figure 4:
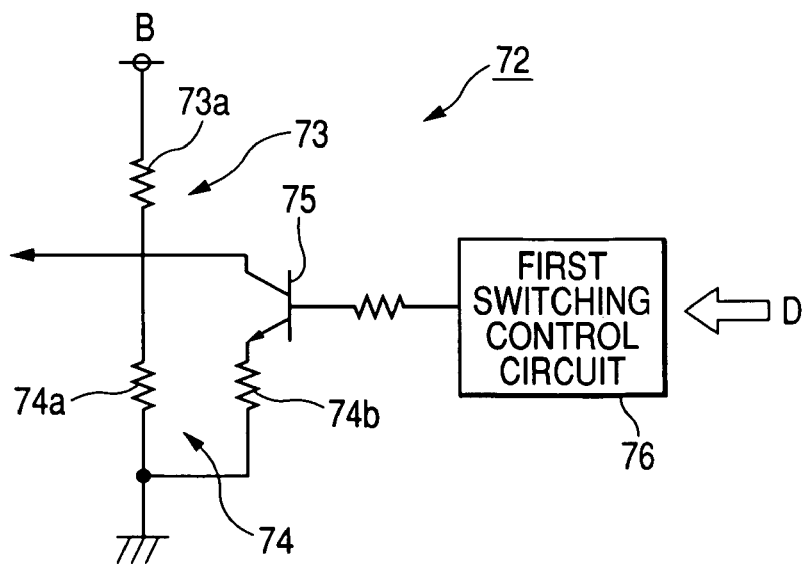
FIG. 4 is a circuit diagram showing the bias power supply used for the frequency converter of the invention.

Furthermore, FIG. 4 shows another example of a configuration of the first bias power supply 72. Referring to FIG. 4, the power supply-side resistor 73 includes the first resistor 73a, and the ground-side resistor 74 includes the third resistor 74a and a fourth resistor 74b connected in parallel to the third resistor 74a through the first switching transistor 75. In addition, a switching voltage is applied from the first switching control circuit 76 to the base of the first switching transistor 75. In this case, the first switching control circuit 76 turns off the first switching transistor 75 when the control voltage Vt is equal to or smaller than the first predetermined value, and the first switching control circuit 76 turns on the first switching transistor 75 when the control voltage Vt is equal to or larger than the first predetermined value. Accordingly, even in this configuration, the same bias voltage as in FIG. 3 can be output.

Figure 5:
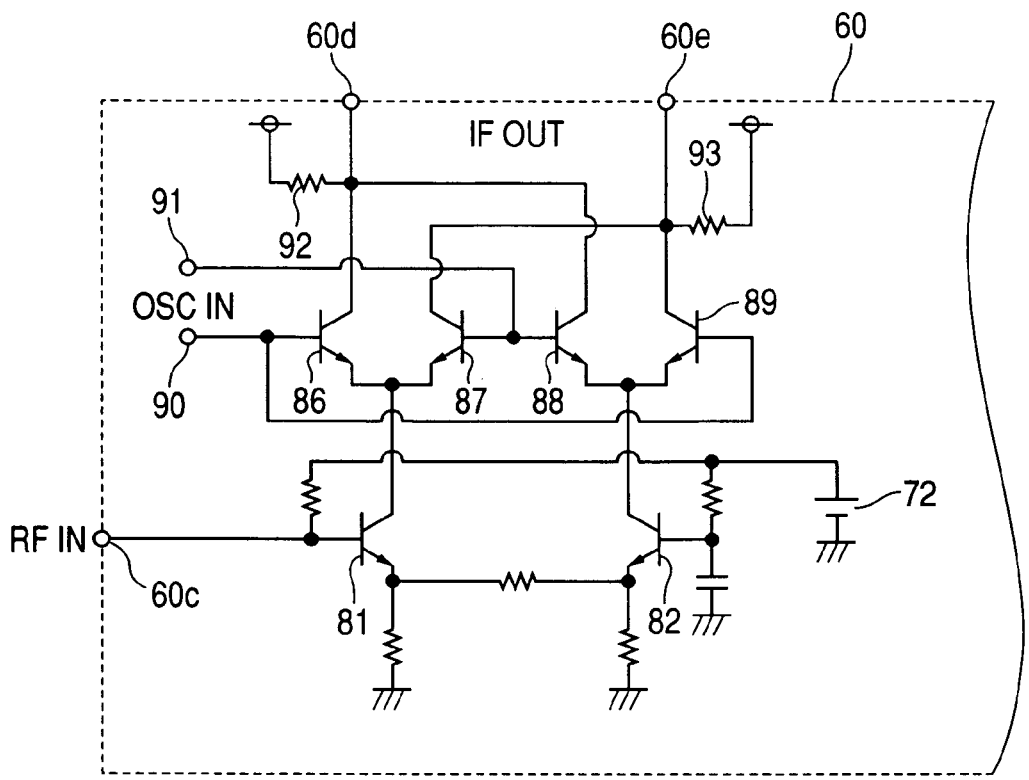
FIG. 5 is a circuit diagram showing a mixer used for the frequency converter of the invention.

FIG. 5 shows a configuration of the mixer 51. A first amplifying transistor 81 and a second amplifying transistor 82 are differentially connected to each other. A base of the first amplifying transistor 81 is connected to the external connection terminal 60c to which the television signal (RF) is input, and a base of the second amplifying transistor 82 is grounded in a high-frequency manner. In addition, a bias voltage supplied from the first bias power supply 72 is applied to the base of the first amplifying transistor 81 and the base of the second amplifying transistor 82.

An emitter of a first mixer transistor 86 and an emitter of a second mixer transistor 87 are connected to a collector of the first amplifying transistor 81. In addition, an emitter of a third mixer transistor 88 and an emitter of a fourth mixer transistor 89 are connected to a collector of the second amplifying transistor 82. Thus, the first mixer transistor 86 and the second mixer transistor 87 are differentially connected to each other, and the third mixer transistor 88 and the fourth mixer transistor 89 are differentially connected to each other.

A base of the first mixer transistor 86 and a base of the fourth mixer transistor 89 are connected to each other and are then connected to an input terminal 90 of an local oscillation signal, and a base of the second mixer transistor 87 and a base of the third mixer transistor 88 are connected to each other and are then connected to an input terminal 91 of the local oscillation signal. The local oscillation signal is balanced-input between the two input terminals 90 and 91.

Further, a collector of the first mixer transistor 86 and a collector of the third mixer transistor 88 are connected to each other and are then pulled up to a power supply through a load resistor 92, and a collector of the second mixer transistor 87 and a collector of the fourth mixer transistor 89 are connected to each other and are then pulled up to the power supply through a load resistor 93. In addition, connection points between the collector of the first mixer transistor 86 and the collector of the third mixer transistor 88 and between the collector of the second mixer transistor 87 and the collector of the fourth mixer transistor 89 are connected to the external connection terminals 60*d* and 60*e* from which intermediate frequency signals are balanced output, respectively.

In the configuration described above, a collector bias current of the first amplifying transistor 81 becomes a collector bias current of the first mixer transistor 86 and a collector bias current of the second mixer transistor 87, and a collector bias current of the second amplifying transistor 82 becomes a collector bias current of the third mixer transistor 88 and a collector bias current of the fourth mixer transistor 89. As such, the collector bias currents of the first mixer transistor 86, the second mixer transistor 87, the third mixer transistor 88, and the fourth mixer transistor 89 are set by the first bias power supply 72.

The television signal is amplified by the first amplifying transistor 81 and the second amplifying transistor 82 and is then input to the emitters of the first mixer transistor 86 and the second mixer transistor 87 and the emitters of the third mixer transistor 88 and the fourth mixer transistor 89. The local oscillation signal is input between the bases of the first mixer transistor 86 and the fourth mixer transistor 89 and between the bases of the second mixer transistor 87 and the third mixer transistor 88, and thus the intermediate frequency signal is output between the collectors of the first mixer transistor 86 and the third mixer transistor 88 and between the collectors of the second mixer transistor 87 and the fourth mixer transistor 89.

In general, the conversion gain of a mixer depends on the level and temperature of an input local oscillation signal. However, when the bias voltage of the first bias power supply 72 is increased, the collector bias current of each transistor increases so as to increase the gain. Accordingly, even though the level of the local oscillation signal is lowered and thus the conversion gain is decreased when the control voltage is lower than the first predetermined value, the decreased conversion gain can be compensated. Further, even though the conversion gain is decreased due to the rise in temperature, the decreased conversion gain can also be compensated.

A tuning frequency of the tuning circuit 50 shown in FIG. 1 changes due to the control voltage Vt applied to a varactor diode used therein, and if the tuning frequency changes, an insertion loss changes. Assuming that the tuning frequency range is divided into a low band, a middle band, and a high band, the insertion loss in the middle band is smaller than those in the other bands. As a result, the gain deviation in the tuner increases. For this reason, when signals included in the middle band are received, a bias voltage applied to the mixer 51 is decreased so as to reduce the gain deviation.

Figure 6:
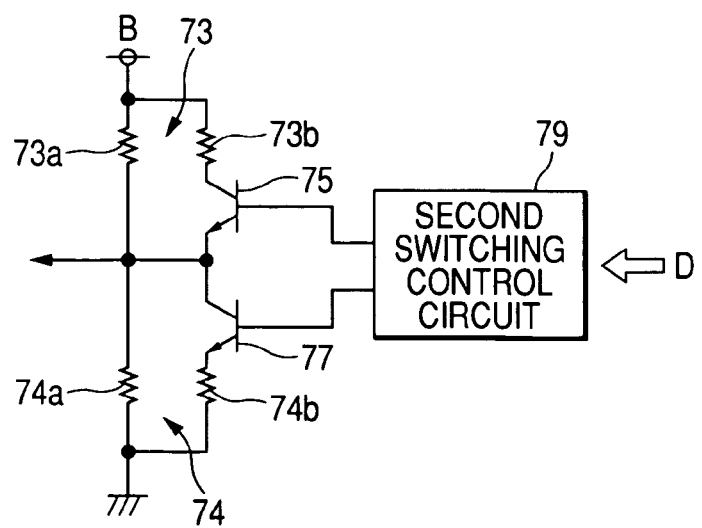
FIG. 6 is a circuit diagram showing another bias power supply used for the frequency converter of the invention.
Figure 7:
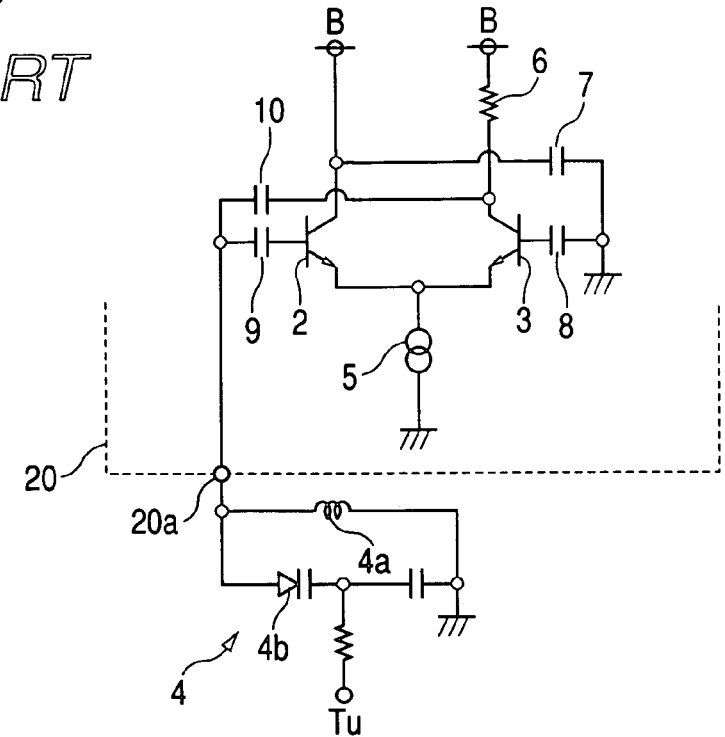
FIG. 7 is a view showing an oscillation circuit used for a conventional frequency converter.
Figure 8:
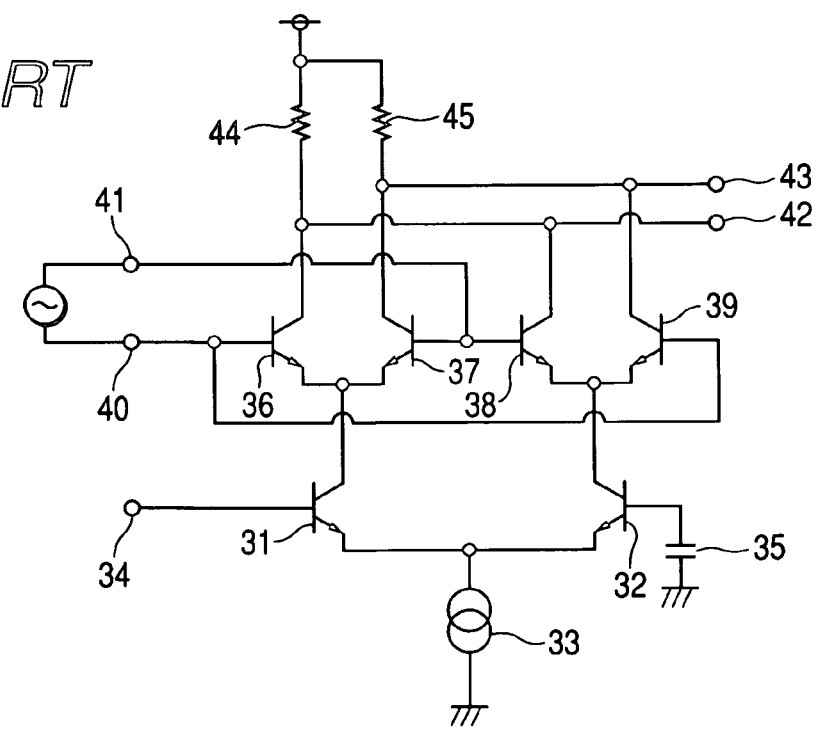
FIG. 8 is a circuit diagram showing a mixer used for the conventional frequency converter.

Accordingly, a second bias power supply 77 shown in FIG. 6 is used instead of the first bias power supply 72 used in the mixer 51 shown in FIG. 5. The second bias power supply 77 includes a power supply-side resistor 73 and a ground-side resistor 74. The power supply-side resistor 73 has a first resistor 73*a* whose one end is pulled up to the power supply and a second resistor 73*b* connected in parallel to the first resistor 73*a* through a first switching transistor 75, and the ground-side resistor 74 has a third resistor 74*a* whose one end is grounded and the other end is connected to the other end of the first resistor 73*a* and a fourth resistor 74*b* connected in parallel to the third resistor 74*a* through a second switching transistor 78.

Furthermore, a base of the first switching transistor 75 and a base of the second switching transistor 77 are connected to a second switching control circuit 79, and frequency data D is input to the second switching control circuit 79. The second switching control circuit 79 turns off the first switching transistor 75 when the control voltage Vt is equal to or larger than the first predetermined value and turns on the first switching transistor 75 when the control voltage Vt is equal to or smaller than the first predetermined value. In addition, the second switching control circuit 79 turns on the second switching transistor 78 when the control voltage Vt is within a range between a second predetermined value and a third predetermined value higher than the first predetermined value and turns off the second switching transistor 78 when the control voltage Vt is not within the range. Accordingly, since the bias voltage decreases when the control voltage Vt is located between the second predetermined value and the third predetermined value, the conversion gain can be lowered.

Since the control voltage Vt corresponds to the frequency data D, it is preferable to set such that the frequency range of the middle band corresponds the second predetermined value and the third predetermined value.

In addition, first to fourth resistors 43*a*, 43*b*, 44*a*, and 44*b* are formed of diffusion resistors, respectively. Those resistors are formed by using a process of manufacturing the integrated circuit 60, and the diffusion resistor is formed by using a PN junction. Since a depletion layer when a reverse bias is applied to the PN junction is expanded or reduced according to the temperature, it is possible to form a resistor having a large temperature coefficient.

What is claimed is:

1. A frequency converter comprising:
a mixer that frequency-converts a received signal to an intermediate frequency signal and has a mixer transistor;
an oscillation circuit that supplies an local oscillation signal to the mixer and has an oscillation transistor;
a resonating circuit coupled to the oscillation transistor and having a varactor diode, a control voltage for controlling an oscillation frequency being applied to a cathode of the varactor diode; and
a bias power supply for setting a collector bias current of the mixer transistor and a collector bias current of the oscillation transistor,
wherein the received signal and the local oscillation signal are input to the mixer transistor, and
when the control voltage is equal to or smaller than a first predetermined value, an output voltage of the bias power supply is set to be increased so that at least one of the collector bias current of the mixer transistor and the collector bias current of the oscillation transistor can be increased.

2. The frequency converter according to claim 1, wherein the output voltage of the bias power supply has a positive temperature coefficient.

3. The frequency converter according to claim 2, wherein the bias power supply includes a power supply-side resistor whose one end is pulled up to a power supply B and a ground-side resistor whose one end is grounded and the other end is connected to the other end of the power supply-side resistor,
the output voltage is output through a connection point between the power supply-side resistor and the ground-side resistor, and
a resistance temperature coefficient of the power supply-side resistor is set to be smaller than a resistance temperature coefficient of the ground-side resistor so that at least one of a resistance value of the power supply-side resistor and a resistance value of the ground-side resistor switches differently when the control voltage is equal to or larger than the first predetermined value and is equal to or smaller than the first predetermined value.

4. The frequency converter according to claim 3,
wherein the bias power supply includes a first bias power supply and a second bias power supply, and
the collector bias current of the oscillation transistor is set by the first bias power supply and the collector bias current of the mixer transistor is set by the second bias power supply.

5. The frequency converter according to claim 4,
wherein, in the first bias power supply, the power supply-side resistor has a first resistor whose one end is pulled up to the power supply and a second resistor connected in parallel to the first resistor through a first switching transistor, and the ground-side resistor has a third resistor whose end is grounded and the other end is connected to the other end of the first resistor, and
the first switching transistor is turned off when the control voltage is equal to or larger than the first predetermined value and is turned on when the control voltage is equal to or smaller than the first predetermined value.

6. The frequency converter according to claim 4,
wherein, in the first bias power supply, the power supply-side resistor has a first resistor whose one end is pulled up to the power supply, and the ground-side resistor has a third resistor whose end is grounded and the other end is connected to the other end of the first resistor and a fourth resistor connected in parallel to the third resistor through a first switching transistor, and
the first switching transistor is turned on when the control voltage is equal to or larger than the first predetermined value and is turned off when the control voltage is equal to or smaller than the first predetermined value.

7. The frequency converter according to claim 4,
wherein a tuning circuit whose tuning frequency is changed by the control voltage is provided at a previous stage of the mixer,
in the second bias power supply, the power supply-side resistor has a first resistor whose one end is pulled up to the power supply and a second resistor connected in parallel to the first resistor through a first switching transistor, and the ground-side resistor has a third resistor whose one end is grounded and the other end is connected to the other end of the first resistor and a fourth resistor connected in parallel to the third resistor through a second switching transistor, and
the first switching transistor is turned off when the control voltage is equal to or larger than the first predetermined value and is turned on when the control voltage is equal to or smaller than the first predetermined value, and the second switching transistor is turned on when the control voltage is within a range between a second predetermined value and a third predetermined value higher than the first predetermined value and is turned off when the control voltage is not within the range.

8. The frequency converter according to claim 4,
wherein the oscillation transistor, the mixer transistor, and the bias power supply are provided within an integrated circuit,
a switching control circuit for switching between on/off of a switching transistor is provided within the integrated circuit, and
frequency data for channel selection is input to the switching control circuit.

* * * * *